(12) United States Patent
Tanaka

(10) Patent No.: US 8,525,210 B2
(45) Date of Patent: Sep. 3, 2013

(54) SEMICONDUCTOR LIGHT EMITTING DEVICE AND METHOD FOR MANUFACTURING THE SAME

(75) Inventor: Satoshi Tanaka, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 13/396,847

(22) Filed: Feb. 15, 2012

(65) Prior Publication Data

US 2012/0205705 A1 Aug. 16, 2012

(30) Foreign Application Priority Data

Feb. 16, 2011 (JP) ................................. 2011-030780

(51) Int. Cl.
*H01L 33/60* (2010.01)
(52) U.S. Cl.
USPC .............................................. 257/98; 438/22
(58) Field of Classification Search
USPC ................. 257/98, E33.06, E33.064; 438/22
See application file for complete search history.

(56) References Cited

U.S. PATENT DOCUMENTS

| 5,861,227 | A  | * | 1/1999 | Ikeda et al. | ..................... | 430/31 |
| 6,171,162 | B1 | * | 1/2001 | Iwasaki et al. | ..................... | 445/6 |
| 7,235,736 | B1 | * | 6/2007 | Buller et al. | ................... | 136/251 |
| 2004/0227457 | A1 | * | 11/2004 | Yamashita | ..................... | 313/503 |
| 2011/0300413 | A1 | * | 12/2011 | Jacobs et al. | ...................... | 429/7 |

FOREIGN PATENT DOCUMENTS

| JP | 2008-053425 A | 3/2008 |
| JP | 2010-192701 A | 9/2010 |

* cited by examiner

*Primary Examiner* — Thao P Le
(74) *Attorney, Agent, or Firm* — Holtz, Holtz, Goodman & Chick, PC

(57) ABSTRACT

A vertical semiconductor light emitting device which can alleviate a concentration of current inside a semiconductor film without impairing the electrical connection between an ohmic electrode and the semiconductor film. The semiconductor light emitting device includes the semiconductor film in contact with a support; a first electrode for partially covering the surface of the semiconductor film opposite to the contact surface with the support; and a second electrode provided on the contact surface side of the semiconductor film with the support. The second electrode includes first and second transparent electrodes made of the mutually same metal oxide transparent electrical conductor and electrically connected to each other, and the second transparent electrode is located to be opposed to the first electrode with the semiconductor film interposed therebetween and has a higher contact resistance with the semiconductor film than the first transparent electrode does.

9 Claims, 4 Drawing Sheets

SEMICONDUCTOR LIGHT EMITTING DEVICE AND METHOD FOR MANUFACTURING THE SAME

BACKGROUND OF THE INVENTION

1. Field of the Invention

The present invention relates to a semiconductor light emitting device such as a light emitting diode (LED).

2. Description of the Related Art

The crystal growth of semiconductor light emitting devices of group III nitride such as GaN has been typically performed using a sapphire substrate. Since the sapphire substrate is not electrically conductive, such semiconductor light emitting devices have been typically configured to take the form of what is called a horizontal semiconductor light emitting device in which an n-electrode and a p-electrode are disposed on the same surface of a semiconductor film. However, recently there have been the establishment of a technique for irradiating the sapphire substrate with a laser beam to strip off the same or a proliferation of an electrically conductive substrate which is mainly made of GaN to be used for growth. It is thus now possible to manufacture what is called a vertical semiconductor light emitting device in which the n-electrode and the p-electrode are provided on the upper surface and the lower surface of the semiconductor film, respectively.

The simplest electrode structure conceivable for the vertical semiconductor light emitting device may be constructed in a manner such that an n-pad-electrode serving as a bonding pad is formed at the center of the surface of an n-type semiconductor layer or a light extraction surface, while a p-electrode is formed generally on the entire area of a p-type semiconductor layer or a mounting surface. However, according to such an electrode structure, current is concentrated immediately below the n-pad-electrode, causing a nonuniform light emission intensity distribution. Furthermore, the current concentration may in turn cause damage to the semiconductor film, degradation in light emission efficiency, and an increase in forward voltage.

In view of the aforementioned problems, a semiconductor light emitting device is disclosed in Patent Literature 1. The semiconductor light emitting device includes a transparent electrode that covers generally the entire area of the surface of an n-type semiconductor layer; an n-pad-electrode provided on the transparent electrode; an auxiliary electrode which is connected to the n-pad-electrode and extends toward the circumferential portion of the transparent electrode; a current blocking layer or an insulator which is located to be opposed to the n-pad-electrode on a surface of a p-type semiconductor layer; and a p-electrode which extends around the current blocking layer on the p-type semiconductor layer. On the other hand, an electrode structure in which two types of electrically conductive layers formed of different materials are disposed side by side on the surface of a semiconductor film is disclosed in Patent Literature 2. Such an electrode structure makes it possible to alleviate current concentration immediately below an n-pad-electrode.

[Patent Literature 1] Japanese Patent Kokai No. 2008-53425

[Patent Literature 2] Japanese Patent Kokai No. 2010-192701

SUMMARY OF THE INVENTION

As disclosed in Patent Literature 1, an ohmic electrode and an insulator layer functioning as a current blocking layer may be disposed side by side on the surface of the p-type semiconductor layer However, in this case, the following problems will arise. That is, to form such an electrode structure, such a method is conceivable which includes forming an insulator layer on the entire surface of a p-type semiconductor layer; removing an unnecessary portion by wet etching or by lift-off; and forming an ohmic electrode on an exposed portion of the p-type semiconductor layer which has been exposed by partially removing the insulator layer. In this case, the exposed surface of the p-type semiconductor layer which has been exposed by removing the insulator layer is contaminated by the residual or resist of the insulator, causing an increase in the contact resistance between the ohmic electrode and the p-type semiconductor layer. The increase in the contact resistance may unpreferably result in an increase in forward voltage. On the other hand, when the ohmic electrode is formed on the surface of the p-type semiconductor layer and then the insulator layer is formed thereon, it may happen, for example, that the insulator layer is formed at excessively high deposition temperatures or sputtered under inappropriate conditions. In this case, the ohmic property of the previously formed ohmic electrode may be impaired, possibly causing an increase in the contact resistance with the p-type semiconductor layer. In other words, an attempt to form the insulator layer without compromising the ohmic property of the previously formed ohmic electrode restricts the deposition temperature or the sputtering condition for the insulator layer. This causes the insulation layer having a necessary and sufficient insulating function to be formed with difficulty.

On the other hand, in the case of the electrode structure in which two types of electrical conductor layers made of different types of materials are disposed side by side on the semiconductor film as disclosed in Patent Literature 2, the aforementioned problem that the semiconductor film surface is contaminated also arises. Furthermore, providing different types of materials so as to be adjacent to each other on the semiconductor film would possibly cause the electrode to be stripped off due to the difference in thermal expansion coefficient between the materials. For example, suppose that the support substrate is bonded by thermocompression bonding or the like onto the electrode of a different type of material. In this case, the heat applied to bond the support substrate would cause the electrode to be stripped off, possibly resulting in poor contact between the semiconductor film and the electrode layer.

The present invention has been developed in view of the aforementioned problems. It is therefore an object of the present invention to provide what is called a vertical semiconductor light emitting device which can alleviate a concentration of current inside the semiconductor film without impairing the electrical connection between the ohmic electrode and the semiconductor film.

A semiconductor light emitting device according to the present invention includes a semiconductor film bonded to a support; a first electrode for partially covering a surface of the semiconductor film opposite to the contact surface with the support; and a second electrode provided on the contact surface of the semiconductor film with the support. The semiconductor light emitting device is characterized in that the second electrode includes a first transparent electrode and a second transparent electrode which are made of the mutually same metal oxide transparent electrical conductor and electrically connected to each other; and the second transparent electrode is located to be opposed to the first electrode with the semiconductor film interposed therebetween and has a higher contact resistance with the semiconductor film than the first transparent electrode does.

Furthermore, a method for manufacturing a semiconductor light emitting device according to the present invention includes the steps of: forming a semiconductor film on a growth substrate; forming a transparent electrode layer on the semiconductor film; forming a support on the transparent electrode layer; removing the growth substrate; and forming a pad electrode which covers part of an exposed surface of the semiconductor film, the exposed surface having been exposed by removing the growth substrate. The method is characterized in that the step of forming a transparent electrode layer includes forming a metal oxide transparent conductive film on the semiconductor film; removing a portion opposed to the pad electrode of the metal oxide transparent conductive film; sintering the metal oxide transparent conductive film by heat treatment; and forming a metal oxide transparent conductive film on the surface of the semiconductor film having been exposed by partially removing the metal oxide transparent conductive film.

According to the semiconductor light emitting device and the manufacturing method of the present invention, what is called the vertical semiconductor light emitting device can alleviate a concentration of current inside the semiconductor film without impairing the electrical connection between the ohmic electrode and the semiconductor film.

DETAILED DESCRIPTION OF THE INVENTION

Now, embodiments of the present invention will be described below in more detail with reference to the accompanying drawings. Note that throughout the figures illustrated, substantially identical or equivalent components or portions are denoted with identical reference symbols.

Figure 1A:
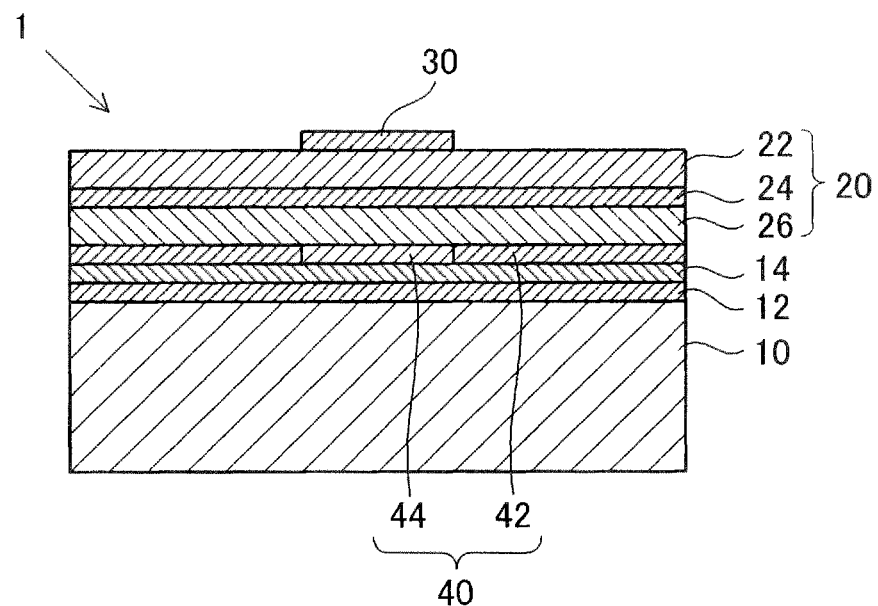
FIG. 1A is a cross-sectional view illustrating the structure of a semiconductor light emitting device according to an embodiment of the present invention.

FIG. 1A is a cross-sectional view illustrating the structure of a semiconductor light emitting device 1 according to an embodiment of the present invention. The semiconductor light emitting device 1 is what is called a vertical light emitting diode which has an n-pad-electrode 30 and a p-electrode 40 disposed on the upper surface and the lower surface of a semiconductor film 20, respectively.

A support substrate 10 has an electrical conductivity and a mechanical strength enough to support the semiconductor film 20, and is formed of a semiconductor substrate of Si or SiC or the like to which electrical conductivity is provided, e.g., by injecting a dopant.

An optical reflective layer 14 is disposed between the p-electrode 40 and the support substrate 10 to form a light-reflecting surface which reflects light emitted from an active layer 24 toward the upper surface of an n-type semiconductor layer 22 which serves as a light extraction surface. The optical reflective layer 14 is formed of a material which has a high optical reflectivity for the wavelength of emitted light. For example, the layer 14 is formed of a single-layer film made of any one of Ag, Al, Rh, and Pd or a stacked layer into which some of those single-layer films are stacked in layers. Note that to make full use of the light-reflecting function, the thickness of the optical reflective layer 14 is preferably equal to or greater than 100 nm.

A bonding layer 12 is formed of a eutectic mixture such as AuSn, so that the support substrate 10 is bonded by a method such as thermocompression bonding or the like to the semiconductor film 20 with the bonding layer 12 therebetween.

The semiconductor film 20 is formed, for example, of a nitride semiconductor expressed by $Al_xIn_yGa_{1-x-y}N$ ($0 \leq x \leq 1$, $0 \leq y \leq 1$). The semiconductor film 20 is formed of the n-type semiconductor layer 22, the active layer 24, and a p-type semiconductor layer 26, which are stacked in layers. The n-type semiconductor layer 22 is doped with a predetermined concentration of Si to have an n-type electrical conductivity. The p-type semiconductor layer 26 is doped with a predetermined concentration of Mg to have a p-type electrical conductivity. The active layer 24 has, for example, a multi-quantum well structure with an InGaN well layer and a GaN barrier layer repeatedly stacked in layers. Note that the semiconductor film 20 may have any layered structure such as the homojunction structure, the single heterojunction structure, or the double heterojunction structure.

On the surface of the n-type semiconductor layer 22, the n-pad-electrode 30 is formed by depositing Ti and Al in layers. The n-pad-electrode 30 is disposed, for example, at the center of the upper surface of the n-type semiconductor layer 22 and serves as a bonding pad for being connected with a bonding wire. The n-pad-electrode 30 is in ohmic contact with the n-type semiconductor layer 22.

The p-electrode 40 covers generally the entire area of the surface of the p-type semiconductor layer 26. The p-electrode 40 is composed of a first transparent electrode 42 extending to a region other than the region immediately below the n-pad-electrode 30 on the surface of the p-type semiconductor layer 26, and a second transparent electrode 44 disposed immediately below the n-pad-electrode 30 on the surface of the p-type semiconductor layer 26. That is, the second transparent electrode 44 is located on the p-type semiconductor layer 26 to be opposed to (overlap with) the n-pad-electrode 30 in a direction parallel to the principal plane of the semiconductor film 20 (i.e., in the lateral direction). The first transparent electrode 42 extends around the second transparent electrode 44 so as not to overlap with the n-pad-electrode 30. The first transparent electrode 42 and the second transparent electrode 44 are electrically and mechanically connected to each other. The first and second transparent electrodes are formed of the mutually same material, for example, a metal oxide transparent electrical conductor such as a tin-doped indium oxide (indium tin oxide (ITO)). The first and second transparent electrodes need not be perfectly transparent but may also be translucent to light from the active layer 24.

The first transparent electrode 42 and the second transparent electrode 44 have mutually different contact resistances with the p-type semiconductor layer 26. That is, the first transparent electrode 42 and the p-type semiconductor layer 26 have a contact resistance of $2 \times 10^{-4}$ $\Omega/cm^2$ to $7 \times 10^{-3}$ $\Omega/cm^2$, while the second transparent electrode 44 and the p-type semiconductor layer 26 have a contact resistance of $2 \times 10^{1}$ $\Omega/cm^2$ or greater. That is, the second transparent electrode 44 has a contact resistance which is equal to or greater than 1000 times that of the first transparent electrode 42. On the other hand, the first transparent electrode 42 has a sheet resistance of 100 to 200 Ω/square, while the second transparent electrode 44 has a sheet resistance of 10 to 40 Ω/square. This difference in electrical characteristics between the first transparent electrode 42 and the second transparent electrode 44 results from the presence of sintering after an ITO film forming these transparent electrodes has been formed. This will be discussed in greater detail later. Such differences in contact resistance with the p-type semiconductor layer 26 allow the first transparent electrode 42 to function as an ohmic electrode, while allowing the second transparent electrode 44 to function as a current control layer for controlling the current to be injected into the semiconductor film 20. The semiconductor film 20 is bonded to the support substrate 10 via the bonding layer 12 with the surface of the p-electrode 40 as the contact surface.

Figure 1B:
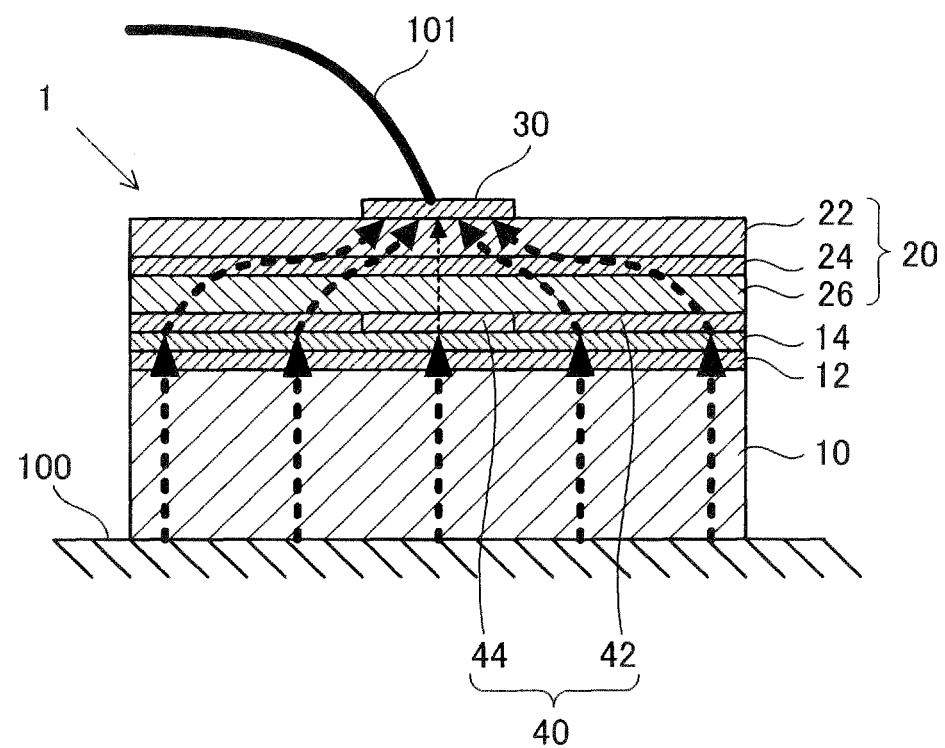
FIG. 1B is a cross-sectional view illustrating the paths of currents flowing inside a semiconductor light emitting device according to an embodiment of the present invention.

FIG. 1B shows, with broken line arrows, the paths of currents flowing through the semiconductor light emitting device 1. The semiconductor light emitting device 1 is supplied with drive power by the rear surface of the support substrate 10 being bonded to a mounting substrate 100 and a bonding wire 101 being connected to the n-pad-electrode 30. Immediately below the n-pad-electrode 30, the second transparent electrode 44 is disposed which has a relatively high contact resistance with the p-type semiconductor layer 26. Accordingly, this restricts current injection from the second transparent electrode 44 to the semiconductor film 20, decreasing the current density of a region immediately below the n-pad-electrode 30. A greater amount of light produced in the region immediately below the n-pad-electrode 30 is blocked by the n-pad-electrode 30 and thus prevented from being emitted outwardly. Accordingly, limiting the current in the region immediately below the n-pad-electrode 30 improves light emission efficiency. On the other hand, a current injection from the first transparent electrode 42, which has a relatively low contact resistance with the p-type semiconductor layer 26, to the semiconductor film 20 is accelerated, resulting in the current extending to the circumferential portion of the semiconductor film 20 to reach the n-pad-electrode 30. That is, the second transparent electrode 44 functions as a current control layer for retarding current concentration immediately below the n-pad-electrode 30, while the first transparent electrode 42 functions as an ohmic electrode for positively injecting current into the semiconductor film 20. The first and second transparent electrodes which are disposed as described above alleviate a current concentration in the region immediately below the n-pad-electrode 30 and accelerate a current diffusion in the horizontal direction of the semiconductor film 20.

Now, a description will be made to a method for manufacturing the semiconductor light emitting device 1 having the aforementioned structure. FIGS. 2A to 2C and FIGS. 3A to 3C are cross-sectional views each showing a processing step in the manufacturing process for the semiconductor light emitting device 1.

Step of Forming Semiconductor Film

To begin with, a growth substrate 50 was prepared. The growth substrate 50 employed in this embodiment was a C-plane sapphire substrate which allowed for forming a GaN-based nitride semiconductor film by metal organic chemical vapor deposition (MOCVD).

The growth substrate 50 was fed into an MOCVD system and heat-treated at a substrate temperature of about 1000° C. in a hydrogen atmosphere for about 10 minutes (thermal cleaning). Subsequently, with the growth temperature being held at 1000° C., TMG (at a flow rate of 45 μmol/min), NH$_3$ (at a flow rate of 4.4 LM), and SiH$_4$ (at a flow rate of 2.7×10$^{-9}$ μmol/min) were supplied for 30 minutes to form the n-type semiconductor layer 22 which is composed of an n-type GaN layer of about 2 μm in thickness.

Now, the active layer 24 having a multi-quantum well structure with five pairs of an InGaN well layer/GaN barrier layer stacked in layers was formed on the n-type semiconductor layer 22. More specifically, after the n-type semiconductor layer 22 was formed, TMG (at a flow rate of 3.6 μmol/min), TMI (at a flow rate of 10 μmol/min), and NH$_3$ (at a flow rate of 4.4 LM) were supplied for 33 seconds at a growth temperature of about 700° C. to form an InGaN well layer which is about 2.2 nm in thickness. Subsequently, TMG (at a flow rate of 3.6 μmol/min) and NH$_3$ (at a flow rate of 4.4 LM) were supplied for 320 seconds to form a GaN barrier layer which is about 15 nm in thickness. Such processing was repeated for five cycles, thereby forming the active layer 24.

Figure 2A:
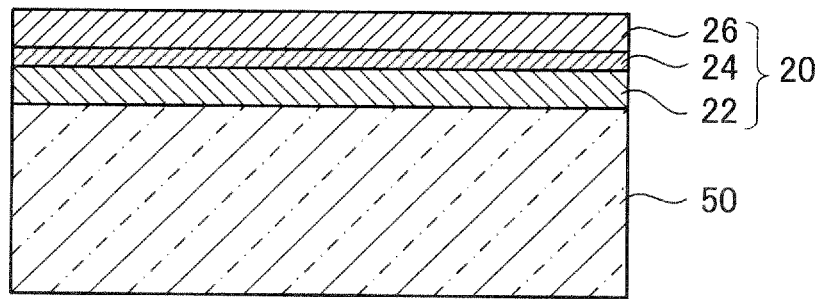
FIGS. 2A to 2C are each a cross-sectional view showing a method for manufacturing a semiconductor light emitting device according to an embodiment of the present invention.

The p-type semiconductor layer 26 was formed by sequential crystal growth of a p-type AlGaN clad layer and an Mg-doped p-type GaN layer. More specifically, TMG (at a flow rate of 8.1 μmol/min), TMA (at a flow rate of 7.5 μmol/min), NH$_3$ (at a flow rate of 4.4 LM), and Cp$_2$Mg (at a flow rate of 2.9×10$^{-7}$ μmol/min) were supplied for 5 minutes at a growth temperature of 870° C. to form, on the active layer 24, a p-type AlGaN clad layer which is about 40 nm in thickness. Subsequently, at the same temperature, TMG (at a flow rate of 18 μmol/min), NH$_3$ (at a flow rate of 4.4 LM), and Cp$_2$Mg (at a flow rate of 2.9×10$^{-7}$ μmol/min) were supplied for 7 minutes to form, on the p-type AlGaN clad layer, a p-type GaN layer of about 150 nm in thickness. As such, the p-type semiconductor layer 26 is formed on the active layer 24 (FIG. 2A).

Step of Activating p-Type Semiconductor Layer

The wafer was taken out of the MOCVD system to activate the p-type semiconductor layer 26. In the growth process, the p-type semiconductor layer 26 contains hydrogen as a mixture, the hydrogen being a raw material for the carrier gas, forming an Mg—H bond. Under this condition, the doped Mg cannot function as a dopant, causing the p-type semiconductor layer 26 to have a high resistance. Thus, the activation step is required to eliminate the hydrogen which exists as a mixture in the p-type semiconductor layer 26. More specifically, the wafer was heat-treated in an inert gas atmosphere at 400° C. or higher to activate the p-type semiconductor layer 26.

Step of Forming First Transparent Electrode

On the surface of the activated p-type semiconductor layer 26, the first transparent electrode 42 was formed which functioned as an ohmic electrode. At a substrate temperature of about 200° C., an ITO film of about 20 nm in thickness was formed by RF sputtering on the surface of the p-type semiconductor layer 26. Then, a resist mask having a predetermined opening pattern was formed on the ITO film to wet-etch the ITO film via the resist mask. As such, the ITO film at the central of the surface of the p-type semiconductor layer immediately below the n-pad-electrode was removed to expose the p-type semiconductor film 26 at the portion from which the ITO film was removed. Note that the ITO film can be formed in the range of substrate temperatures of 150° C. or higher and 300° C. or lower. The crystallization of the ITO is accelerated at substrate temperatures of 150° C. or higher. When crystallization is not accelerated due to low substrate temperatures, the light transmittance of the ITO is significantly reduced to an unpreferable level. On the other hand, at substrate temperatures of 300° C. or higher, crystallization is accelerated, making etching for patterning the ITO film difficult to perform. Furthermore, in this case, reduction in oxygen deficiency resulting from an increase in the amount of oxygen within the ITO film would reduce the concentration of carriers, resulting in the sheet resistance being increased unpreferably.

Figure 2B:
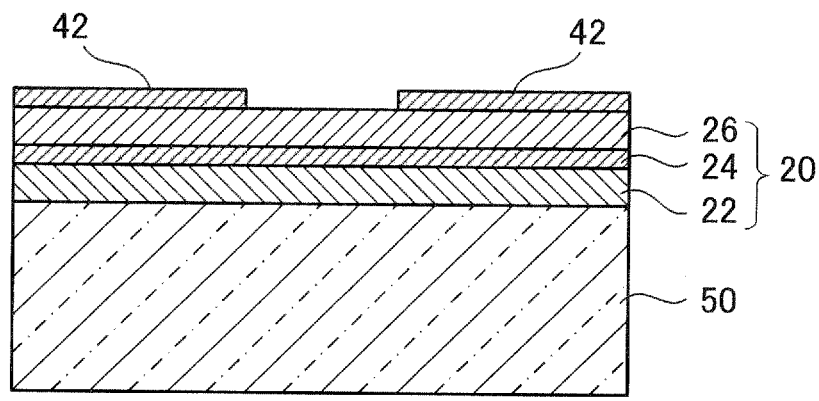

After the resist mask was removed, the wafer was loaded into an oxygen-containing atmosphere at 600° C. for heat treatment for one minute. During this heat treatment, the ITO film was sintered, so that the ITO film forming the first transparent electrode 42 and the p-type semiconductor layer 26 are brought into ohmic contact with each other, leading to a significant reduction in contact resistance. Furthermore, this heat treatment introduces oxygen into the oxygen-deficient portions in the ITO film, providing an improved crystalline property. That is, this heat treatment is said to accelerate crystallization of the ITO film and perform sintering at the same time. Note that the ITO film is preferably heat-treated within the range of temperatures from 500 to 700° C. At heat treatment temperatures of 400° C. or lower, sintering of the ITO film is not accelerated, thereby causing the contact resistance with the p-type semiconductor layer 26 to be insufficiently reduced. On the other hand, at heat treatment temperatures of 800° C. or higher, nitrogen will be unpreferably eliminated in the p-type semiconductor layer 26. Through the steps described above, the first transparent electrode 42 is formed on the p-type semiconductor film 26 (FIG. 2B).

Step of Forming Second Transparent Electrode

Figure 2C:
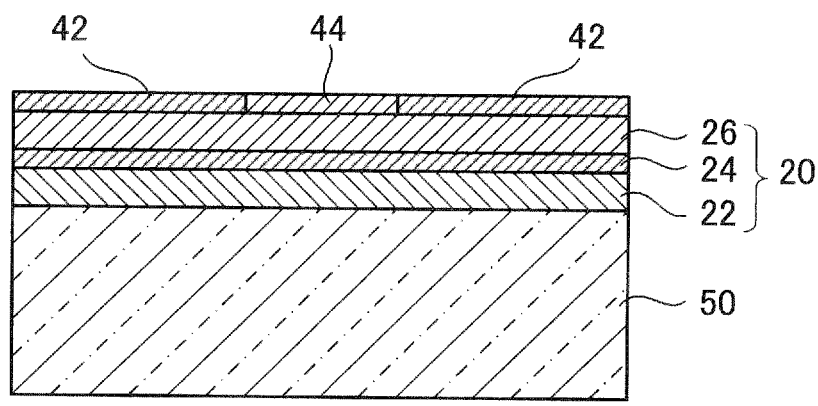

The second transparent electrode 44 serving as a current control layer was formed on the exposed surface of the p-type semiconductor layer 26 which was exposed by partially removing the first transparent electrode 42. That is, the second transparent electrode 44 was disposed at the center of the surface of the p-type semiconductor layer 26 immediately below the n-pad-electrode. Furthermore, the second transparent electrode 44 was formed to be electrically connected to the first transparent electrode 42. More specifically, at a substrate temperature of about 200° C., an ITO film of about 20 nm in thickness was formed by RF sputtering on the exposed surface of the p-type semiconductor layer 26. The ITO film was formed so as to cover the surface of the first transparent electrode 42 as well which was formed in the previous step. Note that the ITO film can be formed in the range of substrate temperatures of 150° C. or higher and 300° C. or lower. Then, a resist mask having a predetermined opening pattern was formed on the ITO film to wet-etch the ITO film via the resist mask, thereby patterning the second transparent electrode 44. Since the crystallization of the first transparent electrode 42 was accelerated by the heat treatment in the previous oxygen atmosphere and thus etched at a significantly low rate, the first transparent electrode 42 would never be removed in this etching step. The ITO film forming the second transparent electrode 44 would not be heat-treated after deposition. That is, the second transparent electrode 44 was not sintered, thus allowing for maintaining the interface status as immediately after the deposition of the ITO film. Accordingly, the second transparent electrode 44 is in nonohmic contact with the p-type semiconductor layer 26, and has a higher contact resistance with the p-type semiconductor layer 26 than the first transparent electrode 42 does. Through the steps described above, the p-electrode 40 is formed which has the first and second transparent electrodes (FIG. 2C).

Step of Forming Optical Reflective Layer

The optical reflective layer 14 was formed by sputtering to deposit Ag in a thickness of about 200 nm on the surface of the p-electrode 40. Note that the optical reflective layer 14 may be formed of a single-layer film of other materials having a high optical reflectivity for the wavelength of emitted light such as Al, Rh, or Pd, or alternatively may also be formed of a stacked layer having any of these materials stacked in layers. Furthermore, to enhance the adhesion properties to the first transparent electrode 42 and the second transparent electrode 44, the metal film having the aforementioned optical reflectivity may be formed with Ti or Ni therebetween. Furthermore, to enhance the adhesion properties to the bonding layer 12, the outermost surface of the optical reflective layer 14 may be an Au layer. Furthermore, to prevent diffusion of the material of the bonding layer 12 into the optical reflective layer 14, an appropriate layer such as a barrier layer can be formed on the optical reflective layer 14.

Step of Bonding Support Substrate

The support substrate 10 which was electrically conductive and had a mechanical strength enough to support the semiconductor film 20 was prepared. A Si substrate which was made electrically conductive by injecting a dopant was used as the support substrate 10. Then, on the surface of the support substrate 10, the bonding layer 12 which was made of AuSn in a thickness of about 1 μm was formed by sputtering. The composition ratio between Au and Sn was a 20 weight percent (wt %) of Sn. Note that the bonding layer 12 may also be formed, by thermocompression bonding or the like, of other materials which can bond the support substrate 10 and the semiconductor film 20 together.

Figure 3A:
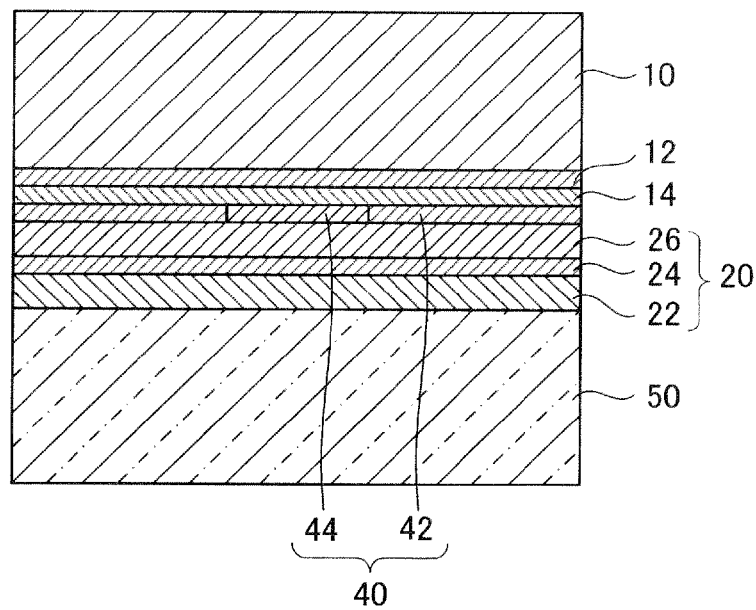
FIGS. 3A to 3C are each a cross-sectional view showing a method for manufacturing a semiconductor light emitting device according to an embodiment of the present invention.

Then, using a wafer bonder, the optical reflective layer 14 on the growth substrate 50 side and the bonding layer 12 on the support substrate 10 side were brought into contact and then heated and pressurized to bond the support substrate 10 to the semiconductor film 20. The support substrate 10 is bonded to the semiconductor film 20 by the eutectic reaction of AuSn which forms the bonding layer 12 (FIG. 3A).

Step of Removing Growth Substrate

Figure 3B:
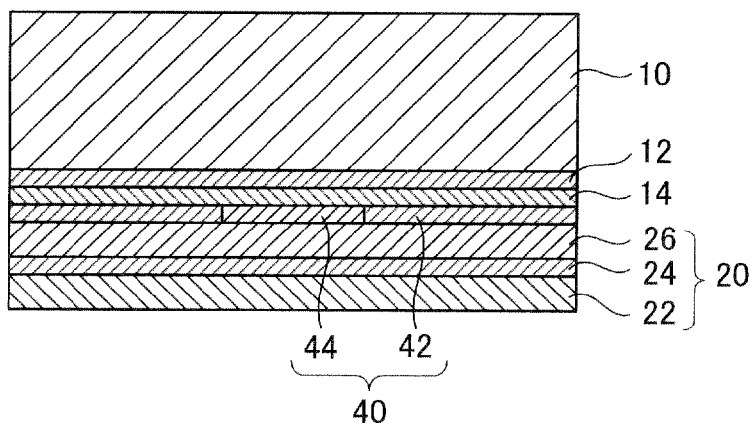

The growth substrate 50 was stripped off from the semiconductor film 20 by laser lift-off (LLO). As a laser light source, an excimer laser was employed. The laser irradiated on the rear surface of the growth substrate 50 reaches the semiconductor film 20 to decompose the GaN in the vicinity of the interface with the growth substrate 10 into a Ga metal and an $N_2$ gas. This allows for forming an air gap between the growth substrate 10 and the semiconductor film 20, causing the growth substrate 10 to be stripped off from the semiconductor film 20. Stripping off the growth substrate 10 causes the n-type semiconductor layer 22 to be exposed. Subsequently, Ga adhered to the exposed surface of the n-type semiconductor layer 22 was removed by hydrochloric acid treatment. Thereafter, the surface of the n-type semiconductor layer 22 may be flattened by reactive ion etching (RIE) using Ar ions or Cl ions or by chemical mechanical planarization (CMP) or the like. Furthermore, to provide improved light extraction efficiency, bumps and dips may also be formed on the surface of the n-type semiconductor layer 22 (FIG. 3B).

Step of Forming n-Electrode

Figure 3C:
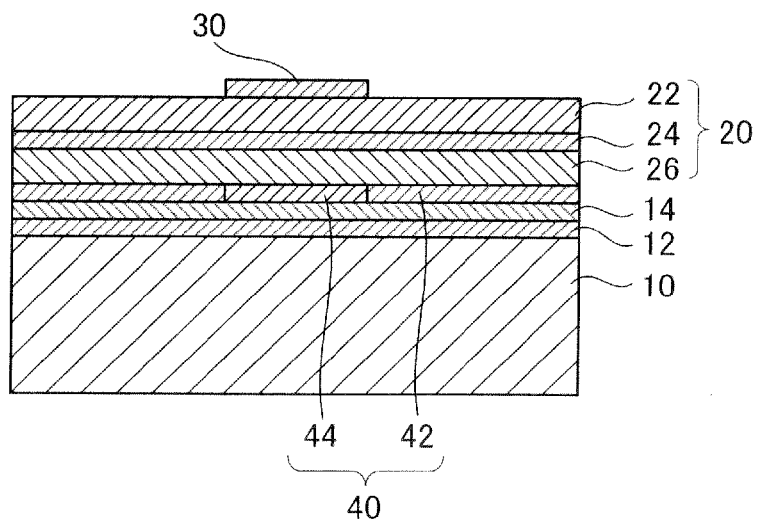

The n-pad-electrode 30 was formed on the surface of the n-type semiconductor layer 22 which was exposed by stripping off the growth substrate 50. A resist mask which had an opening at the region at which the n-pad-electrode 30 was to be formed was formed on the n-type semiconductor layer 22, and subsequently, Ti and Al were sequentially deposited in a thickness of about 1 nm and in a thickness of about 1 μm, respectively, on the wafer by EB vapor deposition. Subsequently, the aforementioned electrode material of an unnecessary portion was removed along with the resist mask, thereby patterning the n-pad-electrode 30. As such, the n-pad-electrode 30 was formed at the center of the surface of the n-type semiconductor layer 22. The n-pad-electrode 30 was located so as to be opposed to (overlap with) the second transparent electrode 44 serving as a current control layer (FIG. 3C).

Through the steps described above, the semiconductor light emitting device 1 was completed. The results of evaluating the various characteristics of the first transparent electrode 42 and the second transparent electrode 44 of the semiconductor light emitting device which was fabricated by the aforementioned manufacturing method are shown below.

Table 1 shows the measured sheet resistance values of the first transparent electrode 42 and the second transparent electrode 44 and the contact resistance with the p-type semiconductor layer 26. Concerning the contact resistance of the first transparent electrode 42 with the p-type semiconductor layer 26, low resistance values were obtained which were sufficiently enough for the first transparent electrode 42 to function as an ohmic electrode. As for the contact resistance of the second transparent electrode 44 with the p-type semiconductor layer 26, preferred values were obtained for the second transparent electrode 44 to function as a current control layer. That is, a distinguished difference in contact resistance was obtained between the first transparent electrode 42 and the second transparent electrode 44. This is because for the first transparent electrode 42, the ITO film was sintered by heat treatment, while for the second transparent electrode 44, the ITO film was not sintered, so that the interface status was maintained as immediately after the deposition of the ITO film. This distinguished difference in contact resistance provided between the first transparent electrode 42 and the second transparent electrode 44 causes current to be injected into the p-type semiconductor layer 26 mainly via the first transparent electrode 42, while almost no current is injected via the second transparent electrode 44. This allows the second transparent electrode 44 to effectively function as a current control layer, alleviating a concentration of current immediately below the n-pad-electrode 30. It is thus possible to accelerate diffusion of current in the lateral direction within the semiconductor film 20, and provide improved light emission efficiency, a uniform light emission distribution, a reduced forward voltage, and improved reliability.

On the other hand, concerning the sheet resistance, it was confirmed that the second transparent electrode 44 was lower in sheet resistance than the first transparent electrode 42. It is thought that the first transparent electrode 42 is higher in sheet resistance than the second transparent electrode 44 because the carrier density was reduced as a result that the heat treatment after the deposition of the ITO film introduced oxygen into an oxygen-deficient portion to accelerate crystallization. However, the absolute value thereof has no problem for practical use. On the other hand, since oxygen was eliminated upon deposition of the ITO film to cause a relatively large number of oxygen-deficient portions and a relatively high carrier density, the second transparent electrode 44 has a relatively low sheet resistance.

TABLE 1

| | First transparent electrode | Second transparent electrode |
|---|---|---|
| Contact resistance | $3.82 \times 10^{-3}$ $\Omega/cm^2$ | $5.13 \times 10^{1}$ $\Omega/cm^2$ |
| Sheet resistance | 100 $\Omega$/square | 22.6 $\Omega$/square |

Figure 4:
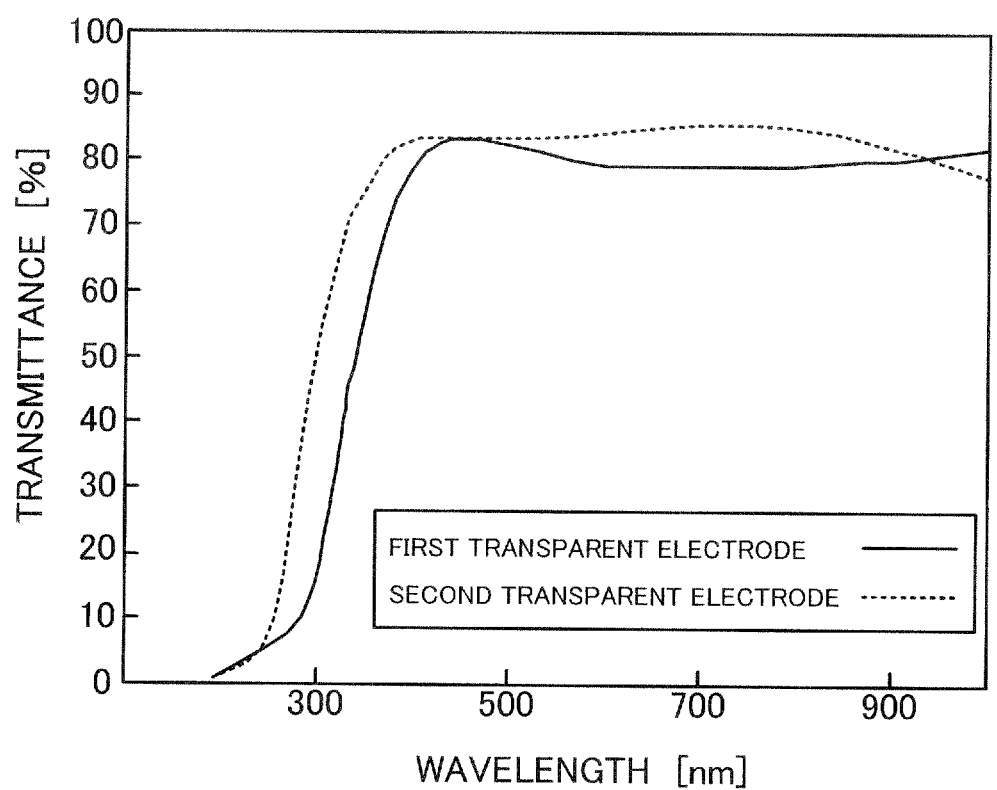
FIG. 4 is a graph showing a transmittance spectrum of a first transparent electrode and a second transparent electrode according to an embodiment of the invention.

FIG. 4 shows the transmittance spectrum of the first transparent electrode 42 (solid line) and the second transparent electrode 44 (broken line). It was found that the second transparent electrode 44 has an optical absorption edge located on the shorter wavelength side as compared with the first transparent electrode 42. This means that the second transparent electrode 44 has a larger band gap and is more transparent to light than the first transparent electrode 42. The second transparent electrode 44 having a high optical transparency allows the entire p-electrode to have improved transmittance, so that light directed to the optical reflective layer 14 or light reflected on the optical reflective layer 14 to be directed to the light extraction surface can be prevented from being attenuated, thus providing improved light extraction efficiency.

As can be seen from the descriptions above, the semiconductor light emitting device according to the embodiment of the present invention is configured such the p-electrode 40 is formed of the first transparent electrode 42 and the second transparent electrode 44 which are significantly different in contact resistance from each other. The first transparent electrode 42 having a relatively low contact resistance with the p-type semiconductor layer 26 functions as an ohmic electrode, while the second transparent electrode 44 having a relatively high contact resistance with the p-type semiconductor layer 26 functions as a current control layer. Since the second transparent electrode 44 is located so as to be opposed to (overlap with) the n-pad-electrode 30 in a direction parallel to the principal plane of the semiconductor film 20, current concentration in the region immediately below the n-pad-electrode 30 is alleviated, so that diffusion of current is accelerated in the semiconductor film 20. It is thus possible to achieve improved light emission efficiency, a uniform light emission distribution, reduction in forward voltage, and improved reliability.

Furthermore, in the semiconductor light emitting device and the manufacturing method according to the embodiment of the present invention, since the first transparent electrode 42 and the second transparent electrode 44 are formed of the same metal oxide electrical conductor, there exists no difference in thermal expansion coefficient therebetween. Accordingly, it is possible to prevent the problem that the p-electrode 40 is stripped off in the step of bonding the support substrate 10 or due to heat to be generated when a high current is applied.

Furthermore, in the semiconductor light emitting device and the manufacturing method according to the embodiment of the present invention, since the second transparent electrode 44 serving as a current control layer is electrically conductive and electrically connected to the first transparent electrode 42, current will be injected also from the second transparent electrode 44 when a large current is input, allowing current to flow through the region immediately below the n-pad-electrode 30. This can make the current distribution in the semiconductor film 20 uniform, thereby preventing an increase in forward voltage upon input of a high current when compared with the current control layer being formed of an insulator.

Furthermore, in the semiconductor light emitting device and the manufacturing method according to the embodiment of the present invention, the surface of the p-type semiconductor layer 26 is not contaminated before the first transparent electrode 42 serving as an ohmic electrode is formed and such heat treatment is not required that may later impair the ohmic property of the first transparent electrode 42. Accordingly, the electrical connection between the first transparent electrode 42 and the p-type semiconductor layer 26 can be maintained in a good condition. Furthermore, the second transparent electrode 44 having a large band gap and a high optical transparency allows the entire p-electrode to have improved transmittance, so that light directed to the optical reflective layer 14 or light reflected on the optical reflective layer 14 to be directed to the light extraction surface can be prevented from being attenuated.

Furthermore, in the semiconductor light emitting device and the manufacturing method according to the embodiment of the present invention, the presence of sintering after the deposition of the ITO film can provide a distinguished difference in contact resistance with the p-type semiconductor layer 26 between the first and second transparent electrodes. This makes it possible to form a current diffusion structure without the intricacy of the manufacturing process. Furthermore, by forming the entire p-electrode of a transparent electrode, the p-electrode 40 can serve as a light-reflecting surface to emit light, which is incident at angles equal to or greater than a critical angle, to outside by total reflection. That is, when compared with a p-electrode formed of a metal having a high reflectivity, the absorption of light can be reduced and thus the light extraction efficiency can be improved.

Note that the first and second transparent electrodes illustrated by way of example in each embodiment above are made of ITO. However, the invention is not limited thereto. The first and second transparent electrodes can also be formed of other metal oxide transparent conductors such as zinc tin oxide (ZTO, $Zn_2SnO_4$), aluminum-doped zinc oxide (AZO), gallium-doped zinc oxide (GZO), antimony-doped tin oxide (ATO), or fluorine-doped tin oxide (FTO). Furthermore, in the examples illustrated in each embodiment above, the present invention is applied to the semiconductor light emitting device having a GaN-based nitride semiconductor layer. However, the present invention is also applicable to a semiconductor light emitting device which has a GaAs-based semiconductor layer or a GaP-based semiconductor layer.

This application is based on Japanese Patent application No. 2011-030780 which is incorporated herein by reference.

What is claimed is:

1. A semiconductor light emitting device comprising:
   a semiconductor film bonded to a support;
   a first electrode for partially covering a surface of the semiconductor film opposite to a contact surface with the support; and
   a second electrode provided on the contact surface of the semiconductor film with the support, wherein
   the second electrode includes a first transparent electrode and a second transparent electrode which are made of the mutually same metal oxide transparent electrical conductor and electrically connected to each other, and
   the second transparent electrode is located to be opposed to the first electrode with the semiconductor film interposed therebetween and has a higher contact resistance with the semiconductor film than the first transparent electrode does.

2. The semiconductor light emitting device according to claim 1, wherein a sheet resistance of the second transparent electrode is lower than a sheet resistance of the first transparent electrode.

3. The semiconductor light emitting device according to claim 1, wherein a band gap of the second transparent electrode is a greater than a band gap of the first transparent electrode.

4. The semiconductor light emitting device according to claim 1, wherein the contact resistance of the second transparent electrode with the semiconductor film is equal to or greater than 1000 times the contact resistance of the first transparent electrode with the semiconductor film.

5. The semiconductor light emitting device according to claim 1, wherein the first and second transparent electrodes are formed of a tin-doped indium oxide.

6. The semiconductor light emitting device according to claim 1, further comprising an optical reflective layer disposed between the support and the semiconductor film.

7. A method for manufacturing a semiconductor light emitting device, comprising the steps of:
   forming a semiconductor film on a growth substrate;
   forming a transparent electrode layer on the semiconductor film;
   forming a support on the transparent electrode layer;
   removing the growth substrate; and
   forming a pad electrode which covers part of an exposed surface of the semiconductor film, the exposed surface having been exposed by removing the growth substrate, wherein
   the step of forming a transparent electrode layer includes
      forming a metal oxide transparent conductive film on the semiconductor film;
      removing a portion opposed to the pad electrode of the metal oxide transparent conductive film;
      sintering the metal oxide transparent conductive film by heat treatment; and
      forming a metal oxide transparent conductive film on the surface of the semiconductor film having been exposed by partially removing the metal oxide transparent conductive film after the step of sintering.

8. The manufacturing method according to claim 7, wherein the heat treatment is performed in an oxygen-containing atmosphere at a temperature at which the crystallization of the metal oxide transparent conductive film is accelerated.

9. The manufacturing method according to claim 7, wherein the metal oxide transparent conductive film forming the transparent electrode layer is made of a tin-doped indium oxide.

* * * * *